United States Patent
Pan et al.

(10) Patent No.: US 10,150,667 B2
(45) Date of Patent: Dec. 11, 2018

(54) PANEL LEVEL PACKAGING FOR MEMS APPLICATION

(71) Applicant: OBSIDIAN SENSORS, INC., La Jolla, CA (US)

(72) Inventors: Yaoling Pan, San Diego, CA (US); Omar Bchir, San Marcos, CA (US)

(73) Assignee: OBSIDIAN SENSORS, INC., La Jolla, CA (US)

( * ) Notice: Subject to any disclaimer, the term of this patent is extended or adjusted under 35 U.S.C. 154(b) by 30 days.

(21) Appl. No.: 15/431,725

(22) Filed: Feb. 13, 2017

(65) Prior Publication Data
US 2018/0230004 A1    Aug. 16, 2018

(51) Int. Cl.
*B81B 7/00* (2006.01)
*B81C 1/00* (2006.01)

(52) U.S. Cl.
CPC .......... *B81B 7/008* (2013.01); *B81C 1/00214* (2013.01); *B81B 2207/012* (2013.01); *B81B 2207/07* (2013.01); *B81C 2201/05* (2013.01); *B81C 2203/0792* (2013.01); *H01L 2924/1461* (2013.01)

(58) Field of Classification Search
CPC ................................................ H01L 2924/1461
See application file for complete search history.

(56) References Cited

U.S. PATENT DOCUMENTS

| | | | | |
|---|---|---|---|---|
| 6,624,003 B1* | 9/2003 | Rice | ........................ | B81B 7/007 438/106 |
| 8,169,041 B2* | 5/2012 | Pahl | ..................... | B81B 7/0064 257/416 |
| 9,040,335 B2* | 5/2015 | Boon Yew | ............ | B81B 7/0061 257/420 |
| 9,056,763 B2* | 6/2015 | Geissler | | |
| 9,257,393 B1 | 2/2016 | Gong et al. | | |
| 9,481,565 B2* | 11/2016 | Pahl | ..................... | B81B 7/0054 |
| 2007/0099327 A1* | 5/2007 | Hartzell | ................ | B81C 1/0023 438/51 |
| 2013/0078753 A1* | 3/2013 | Hayes | ..................... | H01L 24/19 438/51 |
| 2013/0140655 A1* | 6/2013 | Yeh | ........................ | H01L 21/56 257/416 |
| 2015/0091167 A1* | 4/2015 | Geissler | ............. | B81C 1/00261 257/738 |
| 2015/0348936 A1 | 12/2015 | Lin et al. | | |
| 2016/0214857 A1* | 7/2016 | Lin | ........................ | B81B 7/007 |
| 2016/0276325 A1 | 9/2016 | Nair et al. | | |
| 2016/0295700 A1 | 10/2016 | Yu et al. | | |
| 2016/0345106 A1 | 11/2016 | Pahl et al. | | |

* cited by examiner

*Primary Examiner* — Benjamin Sandvik
(74) *Attorney, Agent, or Firm* — Morrison & Foerster LLP

(57) ABSTRACT

Conventional package for integration of MEMS and electronics suffer from profiles that are undesirably high to due to the thickness of the glass. Also in conventional package manufacturing, the MEMS and electronic devices are first individualized, and the individualized MEMS and electronics are combined into a package, and thus can be costly. To address these and other disadvantages, a panel level packaging is proposed. In this proposal, plural MEMS devices are integrated with plural semiconductor devices at a panel level, and the panel is then individualized into separate packages.

11 Claims, 10 Drawing Sheets

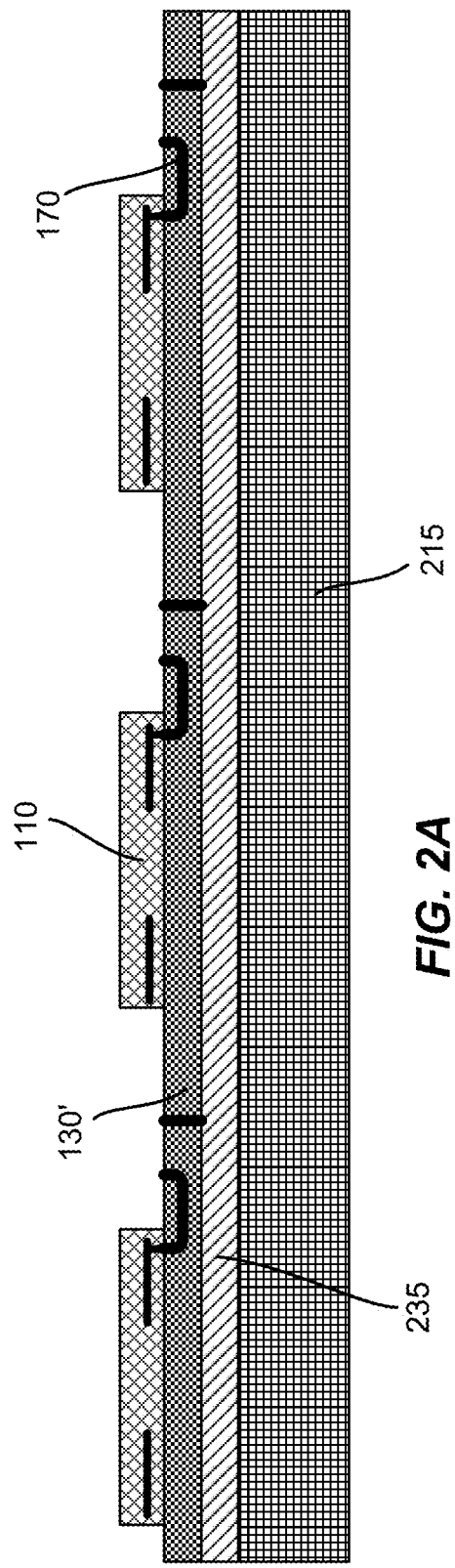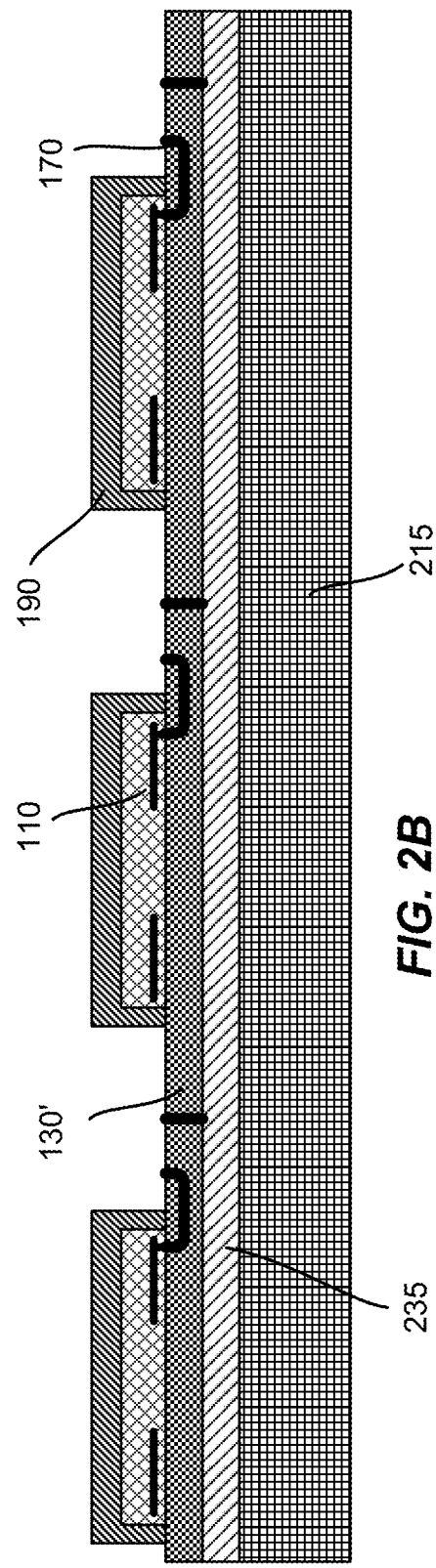

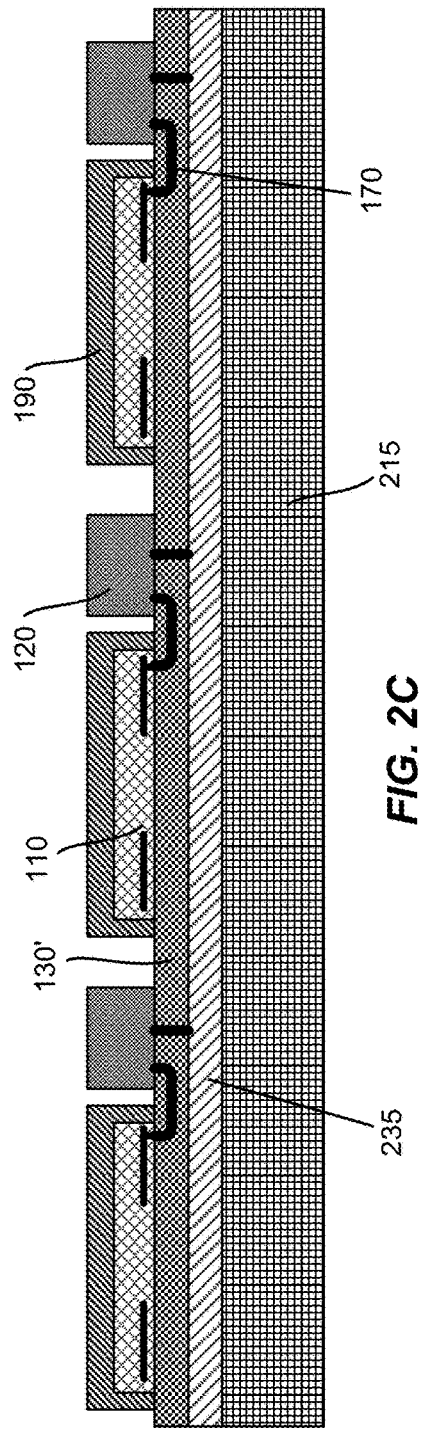
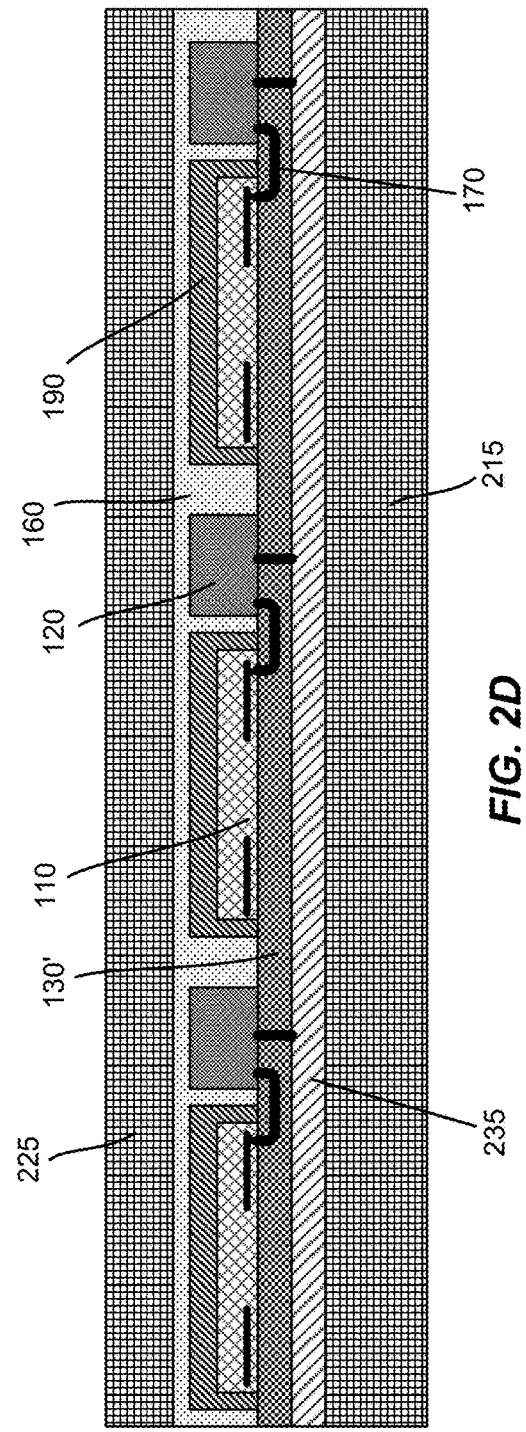

PANEL LEVEL PACKAGING FOR MEMS APPLICATION

FIELD OF DISCLOSURE

The field of the disclosed subject matter relates to panel level packaging. In particular, the field of the disclosed subject matter relates to panel level packaging for MEMS applications and to methods of manufacturing the same.

BACKGROUND

There are mainly three technologies that have been used for micro-electro-mechanical-systems (MEMS) integration and packaging: Chip scale packaging, MEMS on or above CMOS ICs (e.g., application specific integrated circuit (ASIC)) with capping for the packaging, and MEMS and CMOS ASIC interconnect based on through-substrate-vias (TSV) or flip chip bonding. All of these technologies, which require MEMS integration with the electronics (CMOS ICs), have been challenging mainly due to high manufacturing cost, low yield, and lack of integrated packaging solutions.

MEMS-on-glass has been proven to be one of viable solutions for high performance device and low manufacturing cost. A desirable quality of MEMS-on-glass is that devices can be formed on large area relative to when the devices are formed on a silicon substrate. Unfortunately, MEMS-on-glass requires the packaging solution to integrate MEMS devices with the CMOS ASIC devices.

FIGS. 6A, 6B and 6C illustrate examples of conventional packaging of MEMS-on-glass devices with electronics such as ASIC devices. The conventional package 600A illustrated in FIG. 6A comprises a MEMS device 610 formed on a glass substrate 605 and an ASIC device 620. Connections from the MEMS device 610 to an external substrate 645 (e.g., a printed circuit board (PCB)) are provided by through-glass-vias (TGV) 655 and conductive bumps 650. Connections from the ASIC device 620 to the external substrate 645 are provided through the conductive bumps 650 and the wiring on the substrates.

In the conventional package 600B illustrated in FIG. 6B, the MEMS device 610 on the glass substrate 605 are both above the ASIC device 620. Connections from the MEMS device 610 to the ASIC device 602 are provided through the TGVs 655 and the conductive bumps 650. Connections from the ASIC device 620 to the external substrate 645 are provided by wirebonds 665. The conventional package 600C illustrated in FIG. 6C is similar to the conventional package 600B except that the connections from the ASIC device 620 to the external substrate 645 are provided by through-silicon-vias (TSV) 675.

One disadvantage of the conventional packages 600A, 600B, 600C is the high profile. This is mainly due to the thickness of the glass substrate 605, which results in bulky packages. Another disadvantage is that the conventional packages are individually fabricated. An individual MEMS-on-glass device and an individual ASIC device are combined (e.g., the MEMS device 610 is coupled to the ASIC device 620), and the combination is externally coupled to the working substrate 645. Fabricating individual packages can be costly.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary package is disclosed. The package may comprise a first connection layer on an upper surface of a second connection layer, a MEMS device on an upper surface of the first connection layer, an internal connection within the first connection layer, and an external connection within the first and second connection layers. The internal connection may be configured to couple the MEMS device with the semiconductor device. When an interconnect is formed on a lower surface of the second connection layer, the external connection may be configured to couple the MEMS device with the interconnect, or couple the semiconductor device with the interconnect, or both.

An exemplary method of fabricating a package is disclosed. The method may comprise forming a panel of packages, and individualizing the panel of packages into a plurality of individual packages. The panel of packages, prior to individualizing, may comprise a common first connection layer on an upper surface of a common second connection layer, a plurality of MEMS devices on an upper surface of the common first connection layer, a plurality of semiconductor devices on the upper surface of the common first connection layer, a plurality of internal connections within the common first connection layer, and a plurality of external connections within the common first and the common second connection layers. The plurality of internal connections may be configured to couple each MEMS device with each semiconductor device associated with that MEMS device. When a plurality of interconnects are formed on a lower surface of the common second connection layer, the plurality of external connections may be configured to couple each MEMS device with each interconnect corresponding to that MEMS device, or couple each semiconductor device with each interconnect corresponding to that semiconductor device, or both.

An exemplary package is disclosed. The package may comprise a first connection layer on an upper surface of a second connection layer, a MEMS device on an upper surface of the first connection layer, means for internal coupling within the first connection layer, and means for external coupling within the first and second connection layers. The means for internal coupling may couple the MEMS device with the semiconductor device. When an interconnect is formed on a lower surface of the second connection layer, the means for external coupling may couple the MEMS device with the interconnect, or couple the semiconductor device with the interconnect, or both.

BRIEF DESCRIPTION OF THE DRAWINGS

The accompanying drawings are presented to aid in the description of examples of one or more aspects of the disclosed subject matter and are provided solely for illustration of the examples and not limitation thereof.

FIGS. 2A-2H illustrate examples of different stages of fabricating a panel of packages;

DETAILED DESCRIPTION

Figure 1A:
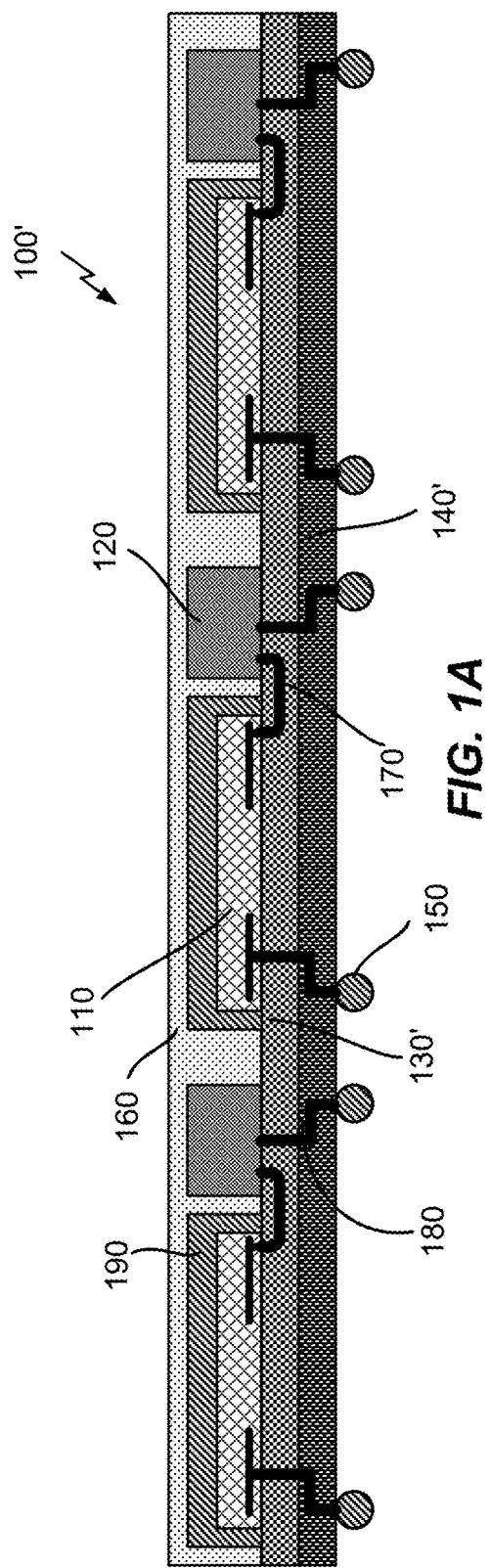
FIG. 1A illustrates an example of a panel of packages.

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

As indicated above, the conventional package has a profile that is undesirably high primarily to due to the thickness of the glass substrate. Also in conventional package manufacturing, individual packages are formed from combining individual MEMS devices with individual ASIC devices. For example, even if multiple MEMS devices are formed on one large glass substrate, the MEMS devices are first individualized, e.g., through dicing. Thereafter, the individual MEMS device is combined with an individual ASIC device into a package.

However, in a non-limiting aspect, it is proposed to initially form packages at a panel, i.e., form a panel of packages comprising a plurality of packages. After forming the panel package, the panel may be individualized into separate packages. In other words, individualization is performed at the end. By forming the panel of packages, fabricating costs can be reduced substantially. Also, one or more aspects of the resulting package may include other benefits such as a low profile as compared to the conventional packages.

FIG. 1A illustrates a non-limiting example of a panel of packages which may include a plurality of packages 100. The panel of packages may comprise a common first connection layer 130' on an upper surface of a common second connection layer 140'. Terms such as "upper", "lower", "top", "bottom", "left", "right" and so on are used merely as terms of convenience, and should not be taken to be limiting. In an aspect, the common first and second connection layers 130', 140' may be in contact with each other. For example, a lower surface of the common first connection layer 130' may contact the upper surface of the common second connection layer 140'. The common first connection layer 130' may be a dielectric layer, and may range in thickness between 0.1 µm and 10 µm, between 10 µm and 50 µm. The common second connection layer 140' may be formed from materials suitable for redistribution layer (RDL) processing such as polyimide and BCB and other dielectric materials, where the interconnects are made of metals such as Cu, Al, Ti, W, Cr, Ni, etc.

The panel of packages may include a plurality of micro-electro-mechanical-systems (MEMS) devices 110 on the upper surface of the common first connection layer 130'. Examples of MEMS devices 110 include sensors (e.g., optical, chemical, pressure, etc.), gyroscopes, transducers (e.g., piezoelectric devices) and so on. The panel of packages may include a plurality of semiconductor devices 120 also on the upper surface of the common first connection layer 130'.

For each MEMS device 110, there may be one or more semiconductor devices 120 associated with that MEMS device 110. A semiconductor device 120 may be configured to convert signals from its associated MEMS device 110 into digital or analog signals for processing (e.g., to detect sound with a MEMS sound sensor) and/or may be configured to send signals to its associated MEMS devices 110 to cause an action to be performed (e.g., to generate sound on a MEMS transducer).

Alternatively, for each semiconductor device 120, there may be one or more MEMS devices 110 associated with that semiconductor device 120. Of course, both types of associations are possible, i.e., at least one MEMS device 110 may be associated with one or more semiconductor devices 120 and at least one semiconductor device 120 may be associated with one or more MEMS devices 110. In FIG. 1A, it may be assumed that each MEMS device 110 is associated with an adjacent semiconductor device 120. In an aspect, it may also be assumed that a MEMS device and its associated semiconductor device 120 are parts of a same package 100.

The panel of packages may include a plurality of internal connections 170 configured to couple the plurality of MEMS devices 110 with the plurality of semiconductor devices 120 so that communications between associated MEMS devices 110 and semiconductor devices 120 can take place. In particular, the plurality of internal connections 170 may be configured couple each MEMS device 110 with each semiconductor device 120 associated with that MEMS device 110.

The plurality of internal connections 170 may be provided within the common first connection layer 130', where the MEMS devices 110 are built upon. The plurality of internal connections 170 may be an example of means for internal coupling. In an aspect, the plurality of internal connections 170 may be pre-wired within common first connection layer 130'. The pre-wired internal connections 170 can also be a part of the MEMS devices 110. It is also contemplated that the plurality of internal connections 170 may be formed through a redistribution layer (RDL) process. However, the pre-wired form may be more preferable. Access to the plurality of internal connections 170 may be provided from the upper and/or lower surface of the common first connection layer 130'. In one non-limiting embodiment, the plurality of internal connections 170 may be exposed at the upper surface of the common first connection layer 130'. In another embodiment, a plurality of pads (not illustrated) connecting to the plurality of internal connections 170 may be provided on the upper surface of the common first connection layer 130'.

The panel of packages may include a plurality of external connections 180 for connections external to the packages 100. For example, when a plurality of interconnects 150 are provided on a lower surface of the common second connection layer 140', the plurality of external connections 180 may couple the plurality of MEMS devices 110 and the plurality of semiconductor devices 120 with the plurality of interconnects 150. For example, the plurality of external connections 180 may couple each MEMS device 110 with each interconnect 150 corresponding to that MEMS device 110. Alternatively or in addition there to, the plurality of external connections 180 may couple each semiconductor device 120 with each interconnect 150 corresponding to that semiconductor device 120. In FIG. 1A, the panel of packages is illustrated having one interconnect 150 corresponding to each MEMS device 110 and to each semiconductor device 120. This is merely an example. Each MEMS device 110 may correspond to zero, one, or multiple interconnects 150. Also, each semiconductor device 120 may correspond to zero, one, or multiple interconnects 150.

The plurality of external connections 180 may be provided within the common first connection layer 130' and the common second connection layer 140'. The plurality of external connections 180 may be an example of means for external coupling. In an aspect, the plurality of external connections 180 may be formed through an RDL process. But in another aspect, portions of the external connections 180 within the common first connection layer 130' may be pre-wired and the RDL processing may be performed to form portions of the external connections 180 within the common second connection layer 140'.

The panel of packages may include a common mold 160 on the upper surface of the common first connection layer 130'. The common mold 160 may be provided so as to encapsulate the plurality of MEMS devices 110 and the plurality of semiconductor devices 120. In an aspect, the common mold 160 may be formed from organic materials. The upper surface of the common mold 160 may be substantially uniform, e.g., may form a plane.

The panel of packages may include a plurality of translation layers 190 formed so as to surround the plurality of MEMS devices 110. In some instances, the MEMS devices 110 may be thinner than the semiconductor devices 120, sometimes significantly thinner. For example, the MEMS devices 110 may have thicknesses less than 10 µm, less than 5 µm, or even less than 3 µm, and the semiconductor devices 120 may have thicknesses greater than 10 µm, 50 µm, or even up to 300 µm). Thus, a height of the MEMS device 110 can be less than a height of the semiconductor device 120. In an aspect, a translation layer 190 may be provided on an upper surface of a MEMS device 110 such that upper surfaces of the translation layer 190 and the semiconductor device 120 are substantially at a same level.

The plurality of translation layers 190 is optional. Note that if the translation layers 190 are not included, the common mold 160 can provide a similar function in that the common mold 160 can encapsulate the plurality of MEMS devices 110. When the translation layers 190 are present, the upper surfaces of the translation layers 190 and the semiconductor devices 120 can be relatively flat, which can be advantageous in some cases.

In an aspect, the panel of packages may be flexible. That is, the common first connection layer 130', the common second connection layer 140', and the common mold 160 may be formed from flexible materials such as plastics, polymers, and metal foils. Note that the glass need not be a part of the panel of packages. This enables the panel of packages to have a small form factor and a very low profile with total package thickness less than 100 µm, less than 50 µm, or even less than 20 µm, which allows the panel of packages to be flexible.

Figure 1B:
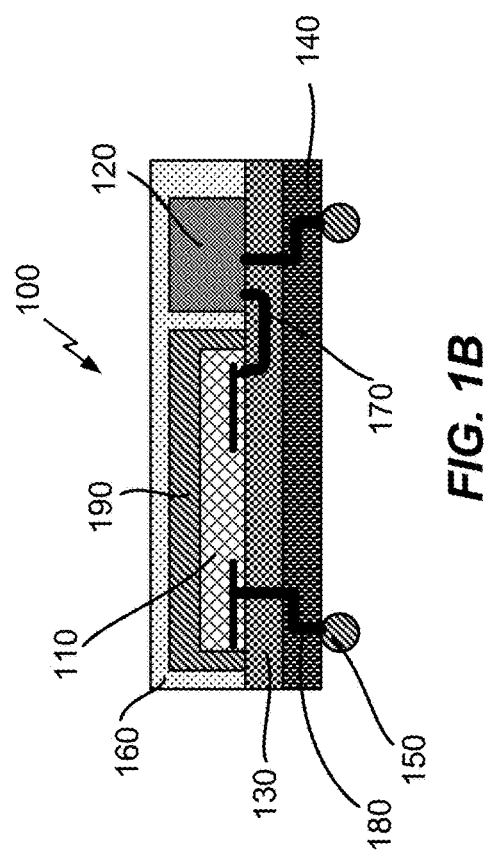
FIG. 1B illustrates an example of an individual package.

FIG. 1B illustrates an example of an individual package 100 resulting from individualizing the panel of packages of FIG. 1A. As seen, the package 100 may include a first connection layer 130 on an upper surface of a second connection layer 140. The first connection layer 130 may be an individualized portion of the common first connection layer 130'. Similarly, the second connection layer 140 may be an individualized portion of the common second connection layer 140'.

The package 100 may include a MEMS device 110 and a semiconductor device 120 on an upper surface of the first connection layer 130. The MEMS device 110 and semiconductor device 120 may respectively be one of the plurality of MEMS devices 110 and one of the plurality of semiconductor devices 120.

The package 100 may include an internal connection 170 configured to electrically couple the MEMS device 110 with the semiconductor devices 120. The internal connection 170 may be one of the plurality of internal connections 170. Recall that in the context of the panel of packages described above, the MEMS device 110 and the semiconductor device 120 may be associated with each other in that they may be configured to communicate with each other. The internal connection 170 enables such communications to take place. The internal connection 170 may be provided within the first connection layer 130 (e.g., pre-wired or through an RDL process) and as part of the MEMS device 110.

The package 100 may include an external connection 180 for each connection external to the package 100. The external connection 180 may be one of the plurality of external connections 180. Note that one or more interconnects 150 may be provided on a lower surface of the second connection layer 140. When an interconnect 150, which may be one of the plurality of interconnects 150, corresponding to the MEMS device 110 is provided, the external connection 180 may be configured to couple the MEMS device 110 with the corresponding interconnect 150. When an interconnect 150 corresponding to the semiconductor device 120 is provided, the external connection 180 may be configured to couple the semiconductor device 120 with the corresponding interconnect 150. Each external connection 180 may be provided within the first connection layer 130 and the second connection layer 140. The external connection 180 may be formed through an RDL process. Alternatively, a portion of the external connection 180 within the first connection layer 130 may be pre-wired or part of MEMS device and the RDL processing may be performed to form a portion of the external connection 180 within the second connection layer 140.

The package 100 may include a mold 160 on the upper surface of the first connection layer 130. The mold 160 may be an individualized portion of the common mold 160. The mold 160 may be provided so as to encapsulate the MEMS device 110 and the semiconductor device 120. The mold 160 may be formed from organic materials. The upper surface of the mold 160 may be substantially uniform, e.g., may form a plane.

The package 100 may include an optional translation layer 190 formed to surround the MEMS device 110. For example, when a height of the MEMS device 110 is less than a height of the semiconductor device 120, the translation layer 190 may be provided such that upper surfaces of the translation layer 190 and the semiconductor device 120 are substantially at a same level. The translation layer 190 may be one of the plurality of translation layers 190. If the translation layer 190 is not present, the mold 160 can encapsulate the MEMS device 110 directly.

In an aspect, the package 100 may be flexible. That is, the first connection layer 130, the second connection layer 140, and the mold 160 may be formed from flexible materials. Again, the package 100 need not include any glass substrate. As indicated, the package 100 can have advantages such as a small form factor, very low profile (e.g., package thickness less than 20 μm), and short connections for low parasitic effect among others.

Figure 1C:
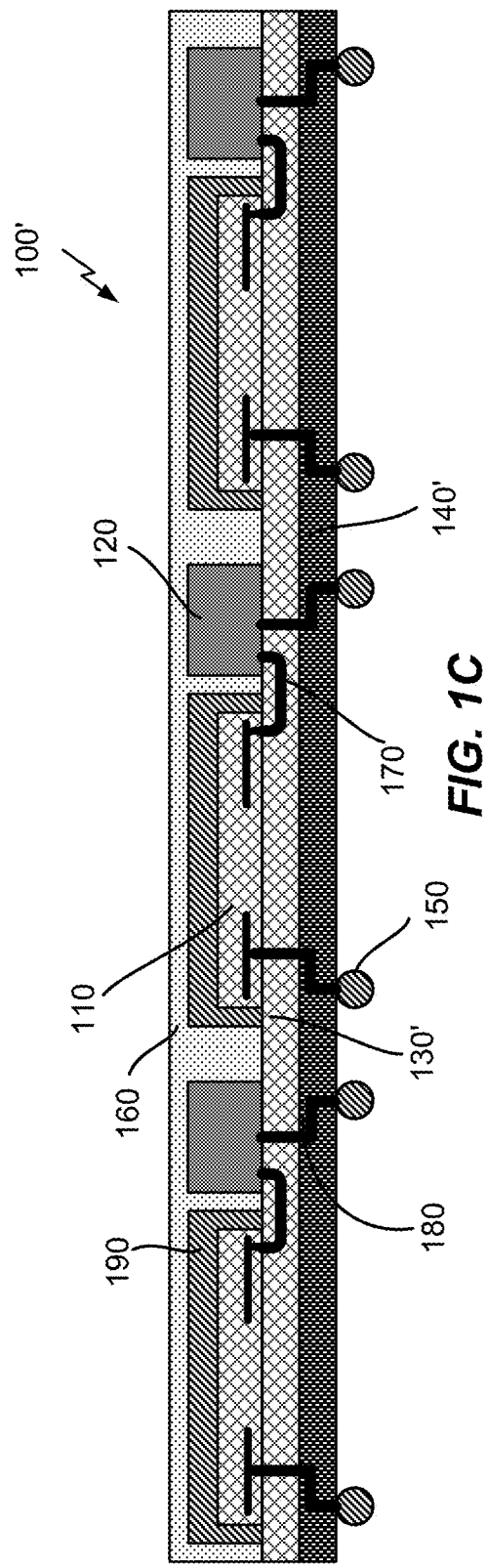
FIG. 1C illustrates another example of a panel of packages.
Figure 1D:
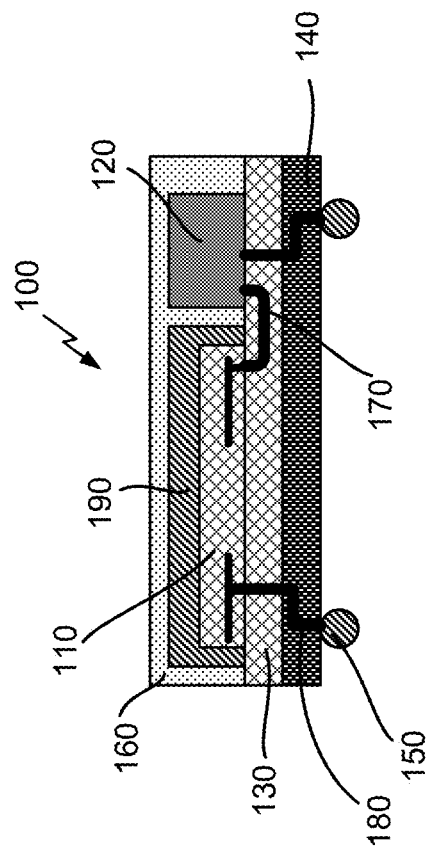
FIG. 1D illustrates another example of an individual package.

FIG. 1C illustrates another non-limiting example of a panel of packages which may include a plurality of packages 100, and FIG. 1D illustrates an example of an individual package 100 resulting from individualizing the panel of packages of FIG. 1C. FIGS. 1C and 1D are similar to FIGS. 1A and 1B, except that the MEMS devices 110, the common first connection layer 130' (FIG. 1C), and the first connection layer 130 (FIG. 1D) are hashed in a same manner. This is to indicate that in an aspect, the common first connection layer 130' and the MEMS devices 110 with the internal connections 170 may be integrally formed, e.g., in a single FEOL process. Indeed, when there are internal connections 170 pre-wired within the MEMS devices 110, such integral combination of the common first connection layer 130' and the MEMS devices 110 may be preferred.

Figure 2E:
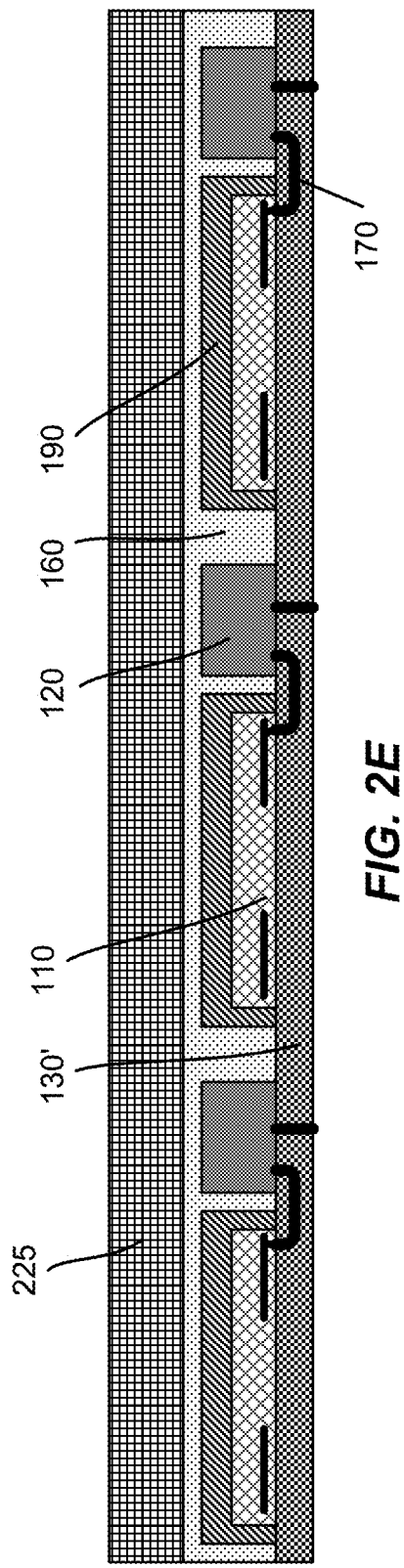

FIGS. 2A-2H illustrate examples of different stages of fabricating a panel of packages such as the panel of packages illustrated in FIG. 1A. While not specifically illustrated, it is to be noted that the illustrated stages may be just as valid for fabricating the panel of packages illustrated in FIG. 1C when it is considered that the MEMS devices 110 and the common first connection layer 130' with the internal connections 170 can be integrally formed. FIG. 2A illustrates a stage in which the common first connection layer 130' may be provided on a first carrier 215, for example a glass substrate. A release layer 235 may be provided in between the common first connection layer 130' and the first carrier 215 such that the common first connection layer 130' is on the release layer 235. In an aspect, the plurality of internal connections 170 may be pre-wired within the common first connection layer 130'.

The plurality the plurality of MEMS devices 110 may be formed on the common first connection layer 130'. In an aspect, the plurality of MEMS devices 110 may be hermetically sealed at the stage illustrated in FIG. 2A. For example, the plurality of MEMS devices 110 may be provided with thin film encapsulations (not shown). If the plurality of internal connections 170 are pre-wired within the common first connection layer 130', then connections between the plurality of internal connections 170 and the plurality of MEMS devices 110 may be automatically established when the plurality of MEMS devices 110 are formed. Alternatively, the internal connections 170 or the common first connection layer 130' can be a part of the plurality of MEMS devices 110 that are fabricated on the panel.

FIG. 2B illustrates a stage in which the plurality of translation layers 190 may be formed on the plurality of MEMS devices 110. As indicated above, this is an optional stage, and may be performed when the heights of the MEMS devices 110 are significantly less than the heights of the semiconductor devices 120.

FIG. 2C illustrates a stage in which the plurality of semiconductor devices 120 may be attached to the common first connection layer 130'. As seen, each semiconductor device 120 may be attached to its designated location adjacent to the MEMS device 110 associated with that semiconductor device 120. If the plurality of internal connections 170 are pre-wired within the common first connection layer 130' or built within the MEMS devices 110, then the act of attaching the plurality of semiconductor devices 120 to the common first connection layer 130' may automatically couple each MEMS device 110 with each semiconductor device 120 associated with that MEMS device 110. The plurality of semiconductor devices 120 may be attached after the plurality of MEMS devices 110 are formed (e.g., may follow the stage of FIG. 2A or FIG. 2B). The electrical coupling between the MEMS device 110 and semiconductor device 120 can be formed with a bonding, e.g., a metal bonding, between internal connections 170 and metal (not shown) on semiconductor device 120. Because of the built-in or pre-wired internal connections 170 in the common first connection layer 130', any alignment shift between the MEMS device 110 and the semiconductor devices 120 can be avoided. That is, alignment accuracy for the electrical connection between the MEMS and the semiconductor devices 110, 120 can be maintained very well during subsequent molding process, substrate releasing process, career attachment process, and RDL processes, discussed in the following.

FIG. 2D illustrates a stage in which the common mold 160 may be formed on the upper surface of the common first connection layer 130' so as to encapsulate the plurality of MEMS devices 110 and the plurality of semiconductor devices 120. If the plurality of translation layers 190 are formed, then the common mold 160 may also encapsulate the plurality of translation layers 190. The upper surface of the common mold 160 may be planarized.

Thereafter, a second carrier 225 may be provided on the common mold 160. The second carrier 225 may also be a glass carrier or flexible substrates. Providing the second carrier 225 is optional. When it is provided, the second carrier 225 can provide mechanical support in later fabrication stages.

FIG. 2E illustrates a stage in which first carrier 215 may be detached from the common first connection layer 130'. The release layer 235 may also be detached if it has been provided earlier. In this way, fabrication processing can take place on the common first connection layer 130'. If the second carrier 235 is provided, it may be preferable to detach the first carrier 215 after providing the second carrier 235. In this way, mechanical support can be present even as the first carrier 215 is removed.

Figure 2F:
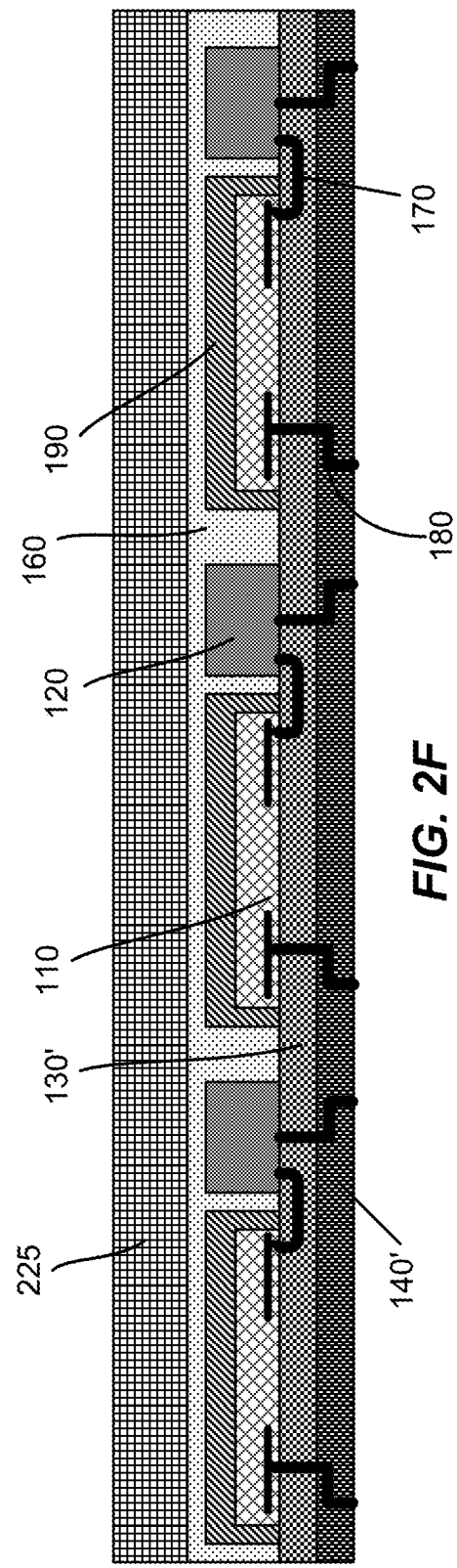

FIG. 2F illustrates a stage in which the common second connection layer 140' may be formed on the lower surface of the common first connection layer 130', and the plurality of external connections 180 may be formed within the common first and second connection layers 130', 140'. The plurality of external connections 180 may be formed through an RDL process involving both the common first and second connection layers 130. Alternatively, the portions of the external connections 180 within the common first connection layer 130' may be pre-wired or part of MEMS devices 110 and the RDL processing may be performed to form portions of the external connections 180 within the common second connection layer 140'. A combination of both is also possible, i.e., some external connections 180 may be formed through an RDL processing involving both common first and second connection layers 130', 140' and others may be formed an RDL processing involving only the common first connection layer 130'.

Figure 2G:
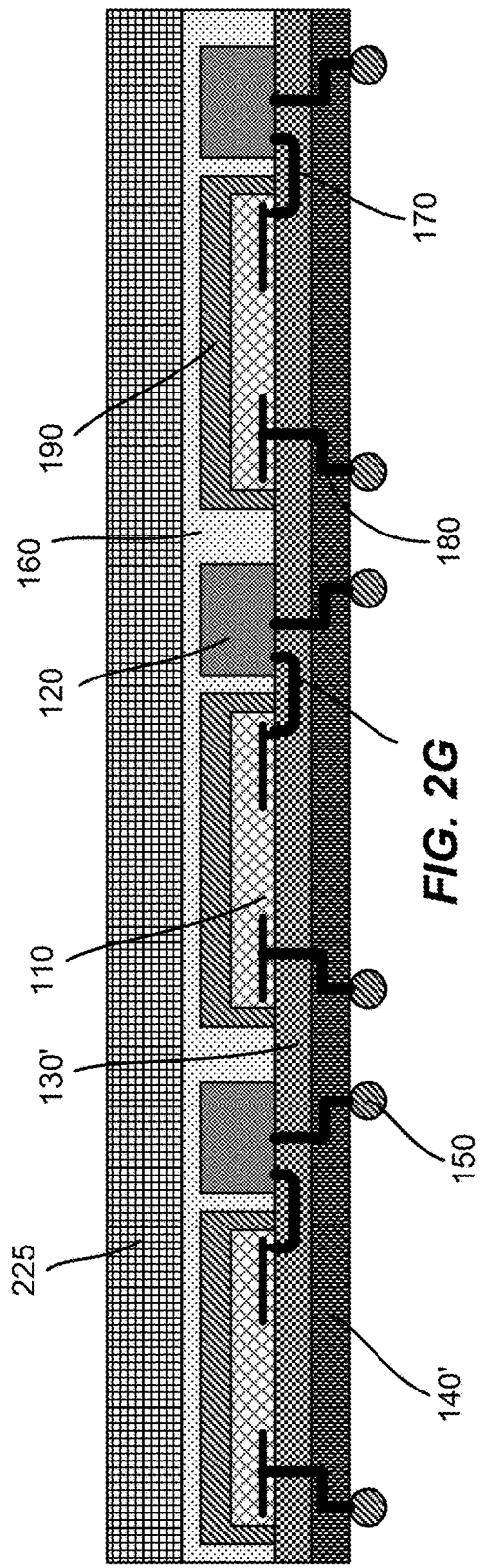

FIG. 2G illustrates a stage in which the plurality of interconnects 150 may be formed on the lower surface of the common second connection layer 140'. When formed, the plurality of interconnects 150 may be coupled with the plurality of MEMS devices 110 and with the plurality of semiconductor devices 120 through the plurality of external connections 180.

Figure 2H:
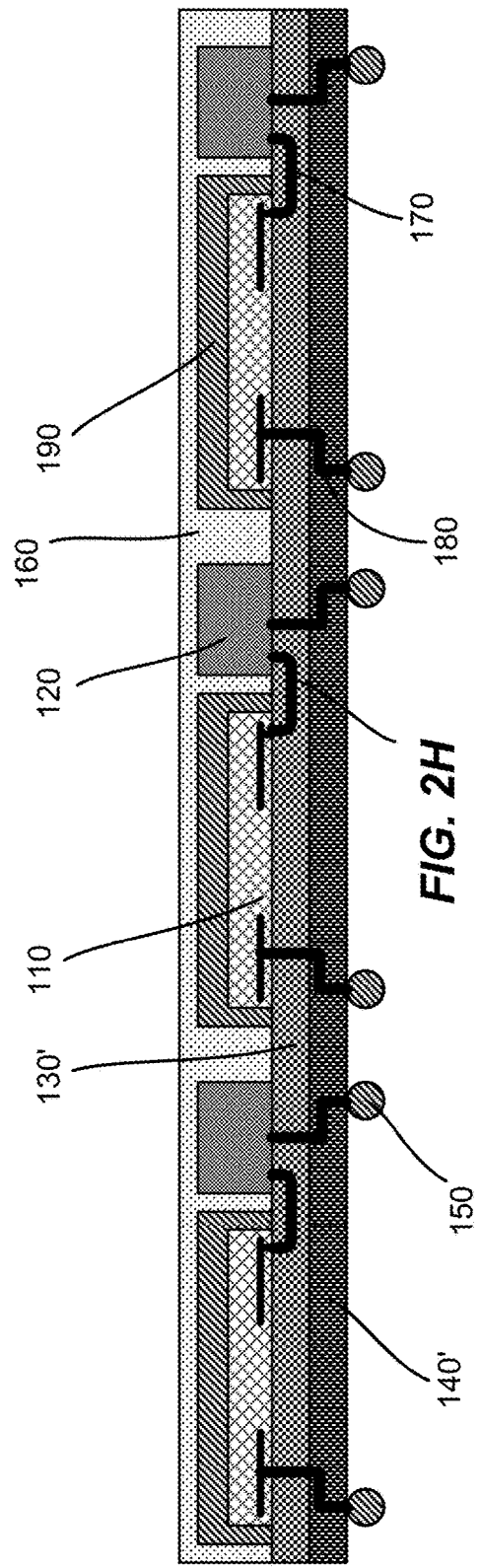

FIG. 2H illustrates a stage in which the second carrier 235 is detached from the common mold 160. This is an optional stage in that it is performed only when the second carrier 235 is attached in the first place. What remains is the panel of packages illustrated in FIG. 1A. Thereafter, the panel of packages may be individualized, e.g., diced, into individual packages 100, an example of which is illustrated in FIG. 1B.

While not specifically illustrated, it is also contemplated that plurality of interconnects 150 being formed after the panel of package is individualized. For example, the second carrier 235 may be detached after the plurality of external connections are formed (see FIG. 2F), and the individualization may take place following the detachment. Thereafter, the plurality of interconnects 150 may be formed on the lower surface of the individualized second connection layers 140.

Figure 3:
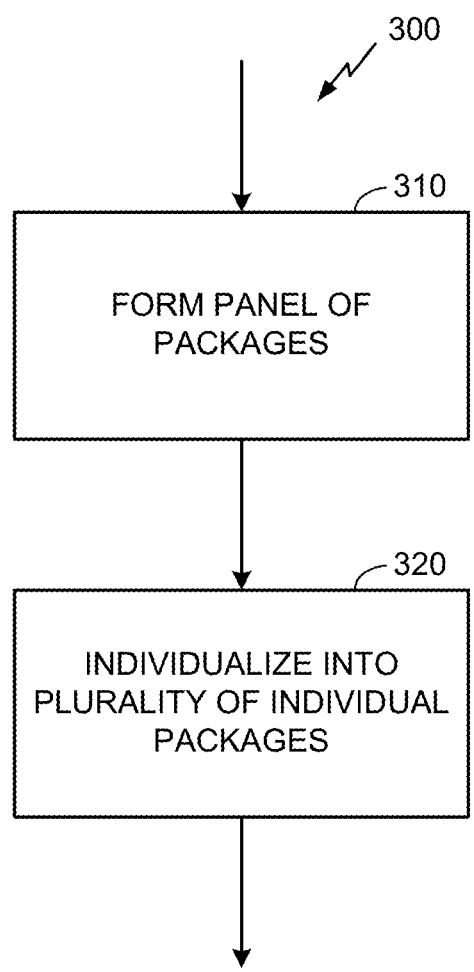
FIG. 3 illustrates a flow chart of an example method of fabricating a package.
Figure 4:
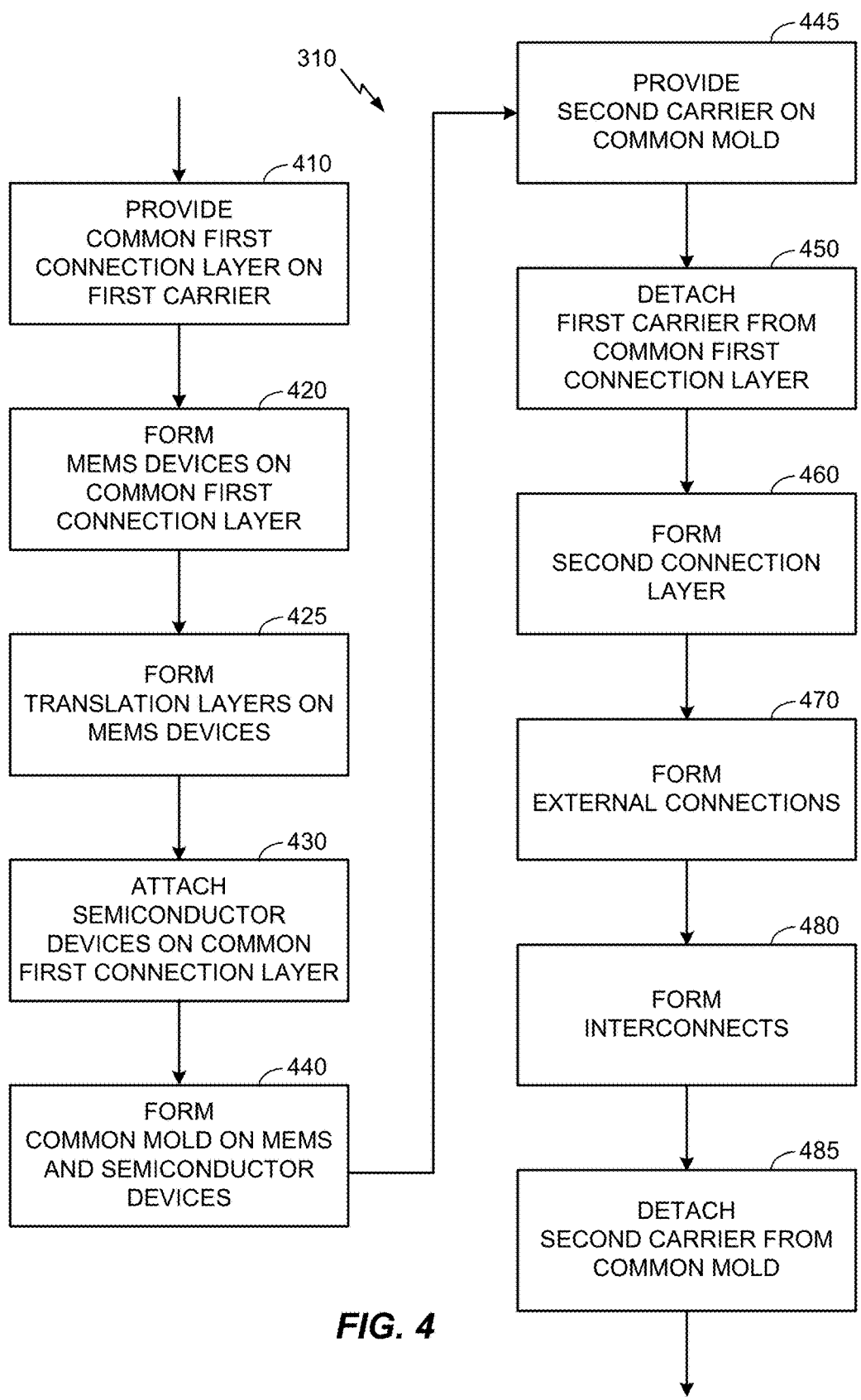
FIG. 4 illustrates a flow chart of an example process of fabricating a panel of packages.

FIGS. 3 and 4 illustrate flow charts of an example method of fabricating a package such as the package 100 illustrated in FIG. 1B or 1D. It should be noted that not all illustrated blocks of FIGS. 3 and 4 need to be performed, i.e., some blocks may be optional. Also, the numerical references to the blocks of these figures should not be taken as requiring that the blocks should be performed in a certain order.

In block 310 of FIG. 3, a panel of packages, such as the panel of packages illustrated in FIG. 1A or 1C may be formed. FIG. 4 illustrates an example process to perform the process of block 310. In block 410, the common first connection layer 130' may be provided on the first carrier 215, and in block 420, a plurality of MEMS devices 110 may be formed on the common first connection layer 130'. Blocks 410 and 420 need not be performed separately. Recall that in an aspect, the common first connection layer 130' and the MEMS devices 110 with the plurality of internal connections 170 may be formed in an integral process. That is, some or all steps of the integral process in performing block 410 (of providing the common first connection layer 130') may also simultaneously be performing block 420 (of forming the MEMS devices 110). For example, the common first connection layer 130' may be formed as part of fabricating the MEMS devices 110. Blocks 410 and 420 may correspond to the stage illustrated in FIG. 2A. In block 425, which is optional, the plurality of translation layers 190 may be formed on the plurality of MEMS devices 110. Block 425 may correspond to the stage illustrated in FIG. 2B.

In block 430, the plurality of semiconductor devices 120 may be attached to the common first connection layer 130'. Block 430 may correspond to the stage illustrated in FIG. 2C. In block 440, the common mold 160 may be formed to encapsulate the plurality of MEMS devices 110 and the plurality of semiconductor devices 120, and possibly the plurality of translation layers 190. In block 445, which is optional, the second carrier 225 may be provided on the common mold 160. Blocks 440 and 445 may correspond to the stage illustrated in FIG. 2D.

In block 450, the first carrier 215 may be detached from the common first connection layer 130'. Block 450 may correspond to the stage illustrated in FIG. 2E. In block 460, the common second connection layer 140' may be formed on the lower surface of the common first connection layer 130'. In block 470, the plurality of external connections 180 may be formed within the common first and second connection layers 130', 140'. Blocks 460 and 470 may correspond to the stage illustrated in FIG. 2F.

In block 480, the plurality of interconnects 150 may be formed on the lower surface of the common second connection layer 140'. Block 480 may correspond to the stage illustrated in FIG. 2G. In block 485, which is performed if block 445 is performed, the second carrier 235 may be detached from the common mold 160. Block 480 may correspond to the stage illustrated in FIG. 2H. Referring back to FIG. 3, in block 320, the panel of packages may be individualized, e.g., diced into individual packages 100. Block 320 may correspond to the stage illustrated in FIG. 1B.

The package and the panel of packages describe above provide numerous advantages. One or more aspects of the proposed package and the panel of packages provide a viable way for MEMS integration with electronics (e.g., semiconductor devices) on a large substrate, i.e., panel level packaging (PLP) can be provided. Since there is no MEMS-on-glass substrate in the final package, a low profile can be achieved. Furthermore due to the pre-wired or built-in connections, total connection lengths in the final package can be much short in comparison to conventional packaging, which results in low parasitic effects (low wiring resistance, low line inductance, etc) for better device signal integrity in the package and power consumption. The lack of glass also makes flexible MEMS/electronics packages possible. The manufacturing cost is low because MEMS devices are built in the packaging and all interconnect processes are done on panel level. In addition, cost can be further reduced since carriers and substrates can be reused.

Figure 5:
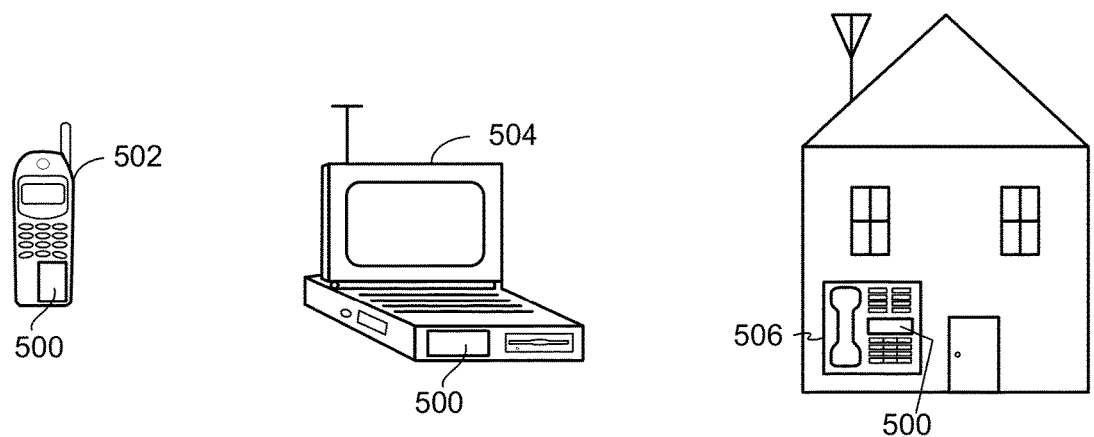
FIG. 5 illustrates examples of devices with a package integrated therein.
Figure 6A:
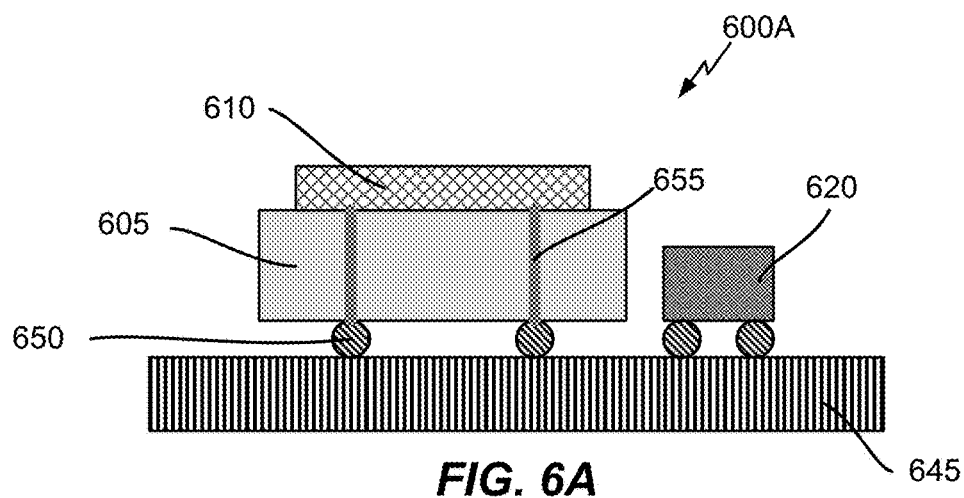
FIGS. 6A-6C illustrate conventional packaging of MEMS devices on glass with ASIC devices.
Figure 6B:
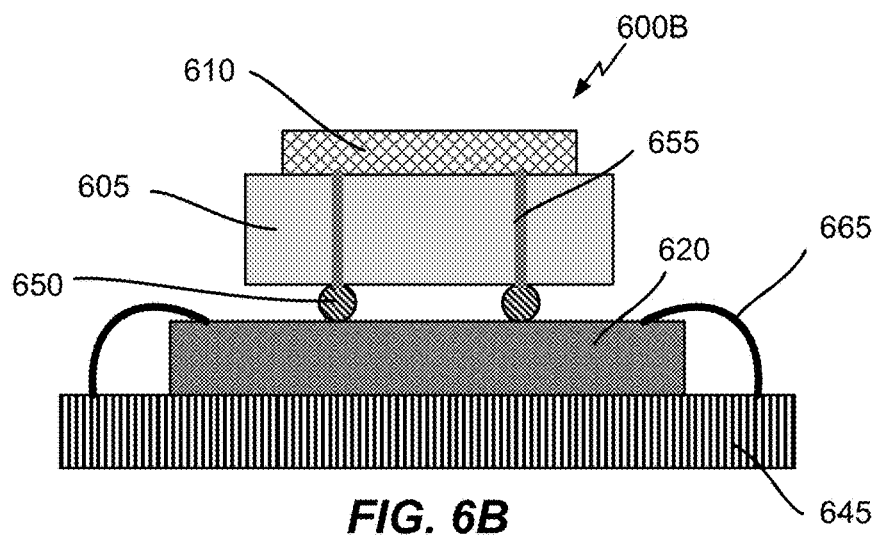
Figure 6C:
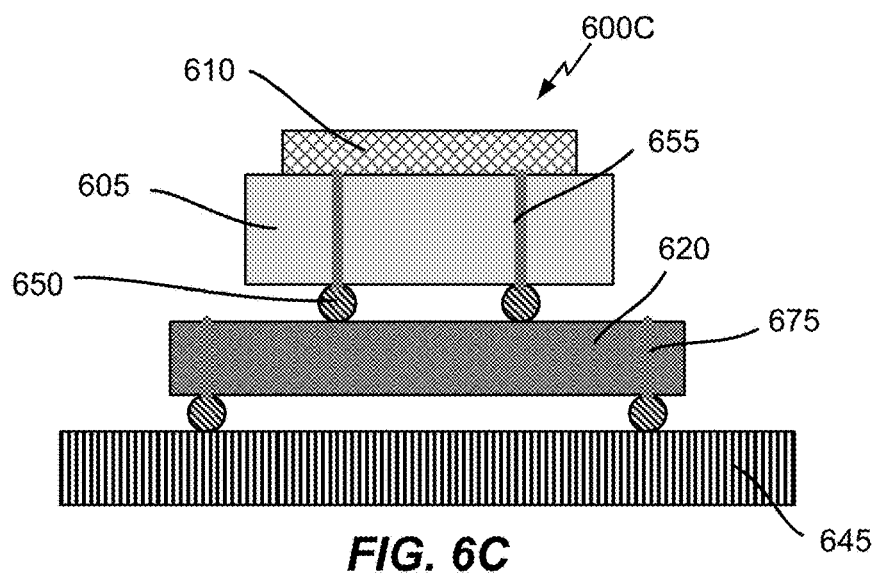

FIG. 5 illustrates various electronic devices that may be integrated with any of the aforementioned package 100. For example, a mobile phone device 502, a laptop computer device 504, a terminal device 506 as well as wearable devices, portable systems, that require small form factor, extreme low profile, may include a device/package 500 that incorporates the package 100 as described herein. The device/package 500 may be, for example, any of the integrated circuits, dies, integrated devices, integrated device packages, integrated circuit devices, device packages, integrated circuit (IC) packages, package-on-package devices, system in package devices described herein. The devices 502, 504, 506 illustrated in FIG. 5 are merely exemplary.

Other electronic devices may also feature the device/package 500 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithms described in connection with the examples disclosed herein may be implemented as electronic hardware, computer software, or combinations of both. To clearly illustrate this interchangeability of hardware and software, various illustrative components, blocks, modules, circuits, and methods have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled with the processor such that the processor can read information from, and write information to, the storage medium. In the alternative, the storage medium may be integral to the processor.

Accordingly, an aspect can include a computer readable media embodying a method of forming a semiconductor device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, processes and/or actions of the method claims in accordance with the examples described herein need not be performed in any particular order. Furthermore, although elements of the disclosed subject matter may be described or claimed in the singular, the plural is contemplated unless limitation to the singular is explicitly stated.

What is claimed is:

1. A method, comprising:
    forming a panel of packages; and
    individualizing the panel of packages into a plurality of individual packages,
    wherein the panel of packages, prior to individualizing, comprises:
        a common first connection layer on an upper surface of a common second connection layer;
        a plurality of micro-electro-mechanical-systems (MEMS) devices on the upper surface of the common first connection layer;
        a plurality of semiconductor devices on the upper surface of the common first connection layer;
        a plurality of internal connections within the common first connection layer and configured to couple each MEMS device with each semiconductor device associated with that MEMS device; and
        a plurality of external connections within the common first and the common second connection layers, wherein when a plurality of interconnects are formed on a lower surface of the common second connection layer, the plurality of external connections are configured to couple each MEMS device with each interconnect corresponding to that MEMS device, or couple each semiconductor device with each interconnect corresponding to that semiconductor device, or both wherein forming the panel of packages comprises:
            providing the common first connection layer on a first carrier;
            forming the plurality of MEMS devices on the common first connection layer;
            attaching the plurality of semiconductor devices to the common first connection layer;
            detaching the first carrier from the common first connection layer;
            forming the common second connection layer on a lower surface of the common first connection layer; and
            forming the plurality of external connections within the common first and the common second connections layers.

2. The method of claim 1, wherein each package, after individualizing the panel of packages, comprises:
    a first connection layer on an upper surface of a second connection layer, wherein the first connection layer is an individualized portion of the common first connection layer and the second connection layer is an individualized portion of the common second connection layer;
    at least one MEMS device of the plurality of MEMS devices on an upper surface of the first connection layer;
    at least one semiconductor device of the plurality of semiconductor devices on the upper surface of the first connection layer;
    an internal connection of the plurality of interconnections within the first connection layer, the internal connection configured to couple the MEMS device with the semiconductor device; and
    an external connection of the plurality of external connections within the first and second connection layers, wherein when an interconnect of the plurality of interconnects is formed on a lower surface of the second connection layer, the external connection is configured to couple the MEMS device with the interconnect, or couple the semiconductor device with the interconnect, or both.

3. The method of claim 1, wherein the common first connection layer is pre-wired with the internal connections such that attaching the plurality of semiconductor devices to the common first connection layer automatically couples each MEMS device with each semiconductor device associated with that MEMS device.

4. The method of claim 1, wherein the plurality of MEMS devices are hermetically sealed prior to attaching the plurality of semiconductor devices to the common first connection layer.

5. The method of claim 1, wherein forming the panel of packages further comprises:
   forming a plurality of translation layers on upper surfaces of the plurality of MEMS devices prior to attaching the plurality of semiconductor devices to the common first connection layer.

6. The method of claim 5,
   wherein the plurality of translation layers are formed on the upper surfaces of the plurality of MEMS devices when heights of the plurality of MEMS devices are less than heights of the plurality of semiconductor devices, and
   wherein the plurality of translation layers are formed such that upper surfaces of the plurality of translation layers are substantially at same levels as upper surfaces of the plurality of semiconductor devices.

7. The method of claim 1, wherein forming the panel of packages further comprises:
   forming a common mold on the upper surface of the common first connection layer subsequent to attaching the plurality of semiconductor devices to the common first connection layer and prior to detaching the first carrier,
   wherein the common mold is formed so as to encapsulate the plurality of MEMS devices and the plurality of semiconductor devices.

8. The method of claim 7, wherein forming the panel of packages further comprises:
   providing a second carrier on the common mold prior to detaching the first carrier; and
   detaching the second carrier from the common mold subsequent to forming the plurality of external connections.

9. The method of claim 1, wherein forming the panel of packages further comprises:
   forming the plurality of interconnects on the lower surface of the common second connection layer.

10. The method of claim 3, wherein at least one MEMS device is also pre-wired with at least one internal connection.

11. The method of claim 1, wherein common first connection layer and the plurality of MEMS devices are formed in an integral process comprising one or more steps such that at least one step of the integral process for providing the first connection layer is simultaneously a step of forming the plurality of MEMS devices.

* * * * *